US006587332B2

(12) United States Patent
Herranen et al.

(10) Patent No.: US 6,587,332 B2
(45) Date of Patent: Jul. 1, 2003

(54) STRUCTURE OF A HOUSING FOR AN ELECTRONIC DEVICE

(75) Inventors: Timo Herranen, Viiala (FI); Tommi Halima, Tampere (FI); Kimmo Viertola, Vesilahti (FI)

(73) Assignee: Nokia Mobile Phones, Ltd., Espoo (FI)

( * ) Notice: Subject to any disclaimer, the term of this patent is extended or adjusted under 35 U.S.C. 154(b) by 0 days.

(21) Appl. No.: 09/894,590

(22) Filed: Jun. 28, 2001

(65) Prior Publication Data

US 2002/0001171 A1 Jan. 3, 2002

(30) Foreign Application Priority Data

Jun. 30, 2000 (FI) ............................................ 20001560

(51) Int. Cl.[7] .............................. G06F 1/16; H05K 7/00
(52) U.S. Cl. ........................ 361/680; 361/752; 400/472
(58) Field of Search ................................ 361/679, 680, 361/686, 752, 825, 814; 200/5 A, 314; 400/472, 682

(56) References Cited

U.S. PATENT DOCUMENTS 4,560,845 A * 12/1985 Takamura et al. .......... 200/5 A
4,772,769 A * 9/1988 Shumate ..................... 200/314
4,839,474 A 6/1989 Hayes-Pankhurst et al. 200/5 A
5,219,067 A 6/1993 Lima et al. .............. 200/302.2
5,298,706 A * 3/1994 English et al. .............. 200/517
5,681,122 A * 10/1997 Burke ........................ 400/472
5,717,429 A 2/1998 Coulon et al. .............. 345/168
5,812,116 A 9/1998 Malhi .......................... 345/168
5,881,866 A 3/1999 Miyajima et al. ........... 200/513
5,966,284 A 10/1999 Youn et al. ................. 361/680

FOREIGN PATENT DOCUMENTS

| | | |
|---|---|---|
| EP | 0148437 | 7/1985 |
| EP | 0478991 A2 | 4/1992 |
| FR | 2576433 | 7/1986 |
| GB | 2086189 A | 5/1982 |

* cited by examiner

*Primary Examiner*—Jayprakash N. Gandhi
(74) *Attorney, Agent, or Firm*—Perman & Green, LLP

(57) ABSTRACT

The present invention relates to a housing (7) which is arranged to constitute at least part of the housing structure protecting at least part of e.g. an electronic device and which comprises at least a front surface (**8*a*), wherein said front surface comprises a recess (10**) for the keyboard of said device.

21 Claims, 2 Drawing Sheets

STRUCTURE OF A HOUSING FOR AN ELECTRONIC DEVICE

CROSS-REFERENCES TO RELATED APPLICATIONS

NOT APPLICABLE

STATEMENT REGARDING FEDERALLY SPONSORED RESEARCH OR DEVELOPMENT

NOT APPLICABLE

BACKGROUND OF TH INVENTION

1. Field of the Invention

Figure 1:
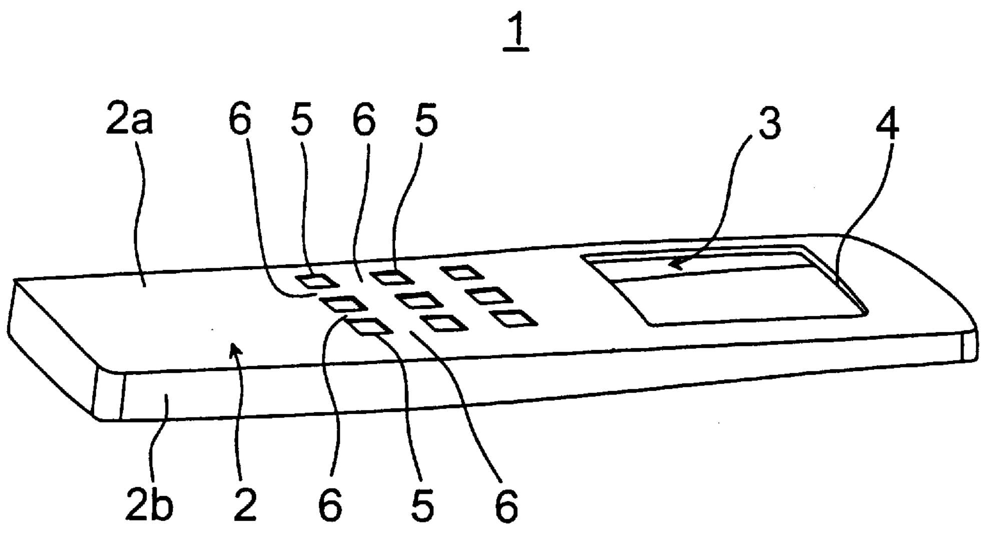
Fig. 1 PRIOR ART

The present invention relates to a housing for an electronic device as set forth in the preamble of claim 1. The invention also relates to an electronic device comprising a housing protecting the device, as set forth in the preamble of claim 7. Furthermore, the invention relates to a method in the manufacture of a housing for an electronic device as set forth in the preamble of claim 10.

(2) Description of Related Art Including Information Disclosed Under 37 CFR 1.97 and 1.98

For storing various information, devices are available according to prior art, such as notepad computers, small hand-held computers, or PDA devices (Personal Digital Assistant). Data can be viewed by means of the display of the device. The data are normally entered in these devices by means of a keyboard. Also wireless communication devices, such as mobile phones, comprise a keyboard and a display for storing or selecting telephone numbers. Known devices include Nokia 8110, 7110 and 6110 mobile phones. It is also known that devices are available which comprise a combination of two different user interfaces, for example the user interfaces of a mobile phone and a PDA device. One such known device is Nokia 9110 Communicator, whose first user interface is a PDA user interface and second interface is a CMT (Cellular Mobile Telephone) user interface for mobile station functions. The above-described communicator comprises separate keyboards and displays for the different user interfaces in the opened and closed positions of the device, wherein the PDA user interface is on the inner surfaces of the two hinged housings of the device, and the CMT user interface is on the outer surface of one housing.

In prior art, the key caps of a PDA/CMT device are attached to a rubber key pad positioned onto a circuit board inside the device. The lower surface of the pad is provided with metal domes for clicking and electrical short circuiting. The keys give the user's finger a feel of operation both upon pressing and releasing the key. The feel is transferred by a click of the key which can be felt and often also heard. The click and feel are produced in a known way by means of tensioned cupola-like or dome-like structures when they are moved, the force required for compression being varied. By the dome, the key pad is provided with a bulge to which a key cap is attached. The keys extend through holes made in the housing of the device, and the housing simultaneously constitutes a frame protecting the key pad and the circuit board. Alternatively, the key cap can be attached by means of a conical collar, whose buckling upon pressing of the key gives a feel of operation. The lower surface of the key is provided with a conductive material for short circuiting.

The structure according to prior art involves, however, the problem that the size of the key caps cannot be increased, because frame necks would become too thin or narrow in view of the manufacture and strength. The necks are formed between holes and openings made in the frame structure. For this reason, the size of the keys must be limited, and they must be placed at a distance from each other, which also limits the design of the whole structure. In particular, the alternatives for designing the electronic device and its keyboard are restricted; for example, in devices which become smaller and smaller, it is difficult to enlarge the keys to facilitate the use of the keys.

Keys of prior art are presented e.g. in patent publication U.S. Pat. No 5,881,866 which discloses key domes contained in a key pad and a key cap which presses the key pad by means of an actuator and is attached at its edge parts to the key pad. One solution for the structure of a keyboard for an electronic device, particularly a portable computer, is presented in U.S. Pat. No. 5,812,116. Another keyboard structure is presented in patent publication U.S. Pat. No. 5,717,429, in which the key caps are separately attached to a means corresponding to a key dome. Another keyboard structure for an electronic device is presented in patent publication U.S. Pat. No. 4,839,474, in which the key caps are attached to the key pad by means of a flexible neck.

It is an aim of the present invention to provide an improvement to prior art. In particular, the aim is to provide a new housing for an electronic device, making it possible to use new keyboard constructions and variable designs, particularly the housing makes it possible to fit large key caps placed next to each other in the housing. Thanks to the invention, the necks of the housing can be retained and they can be even increased, wherein the housing structure becomes strong also by the keyboard.

BRIEF SUMMARY OF THE INVENTION

The housing according to the invention is characterized in what will be presented in the characterizing part of claim 1. The electronic device according to the invention is characterized in what will be presented in the characterizing part of claim 7. The method according to the invention is characterized in what will be presented in the characterizing part of claim 10.

The invention is based on the idea in which the housing is provided with a recess for placing the keyboard, particularly its key caps. The pressings of the key caps are transferred via openings made in the bottom of the recess to the key pad. These openings can also be sealed more easily to prevent the entry of moisture and dirt inside the device, particularly on the circuit board. The recess is provided by lowering that part of the surface of the housing which covers the keyboard. Now, the key caps are placed on top of the housing, simultaneously also on top of the openings in the housing, and not inside said openings as in prior art.

A particular advantage is also achieved by the invention in that the keys can be placed on the same level with the surface of the rest of the cover part. A considerable advantage in view of the manufacture is also the fact that the shapes of the key caps and the shapes of the openings made in the housing do not need to match, because the key caps are placed on top of the openings. This makes it possible that a variety of different, even exchangeable designs and constructions of key caps can be placed in the same housing.

Another advantage is that the relative size of the keys and particularly the key caps, when compared to the size of the device, can be increased. Moreover, the spaces between the key caps can be made very small, which will also prevent foreign particles from entering in the keyboard. Another advantage is that the upper part of the key can be flat, but the lower part can be relatively narrower, wherein other electronics of the device can be placed underneath the key caps in the recess, as the invention increases the space available. According to an advantageous embodiment, the microphone of a CMT device, or for example a buzzer, is placed in the recess, wherein space or openings do not need to be arranged for them in other parts of the housing.

In the assembly, an advantage is also achieved in that the key caps and the key pad can now be attached to the housing, which can be performed as a separate step and in a different place than the assembly of the electronic device.

In the following, the invention will be described in more detail by using as an example an advantageous embodiment of the invention, and particularly a CMT device. It is obvious that the invention can also be applied in other devices within the scope of the claims to achieve the above-mentioned advantages. At the same time, reference is made to the appended drawings, in which:

BRIEF DESCRIPTION OF THE SEVERAL VIEWS OF THE DRAWING(S)

Figure 2:
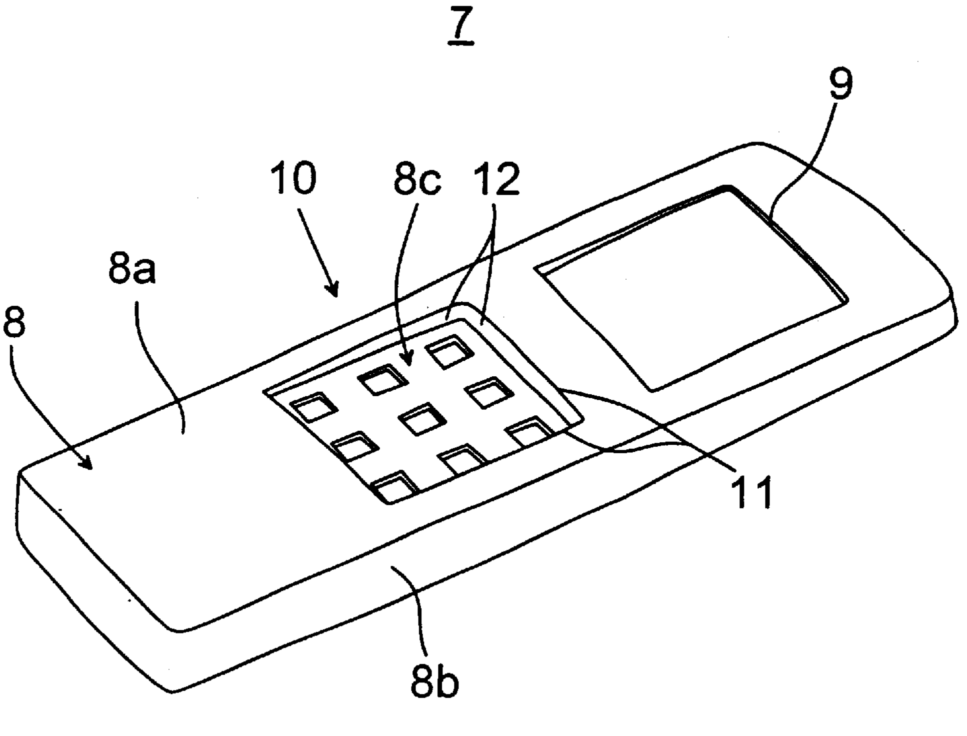
Figure 3:
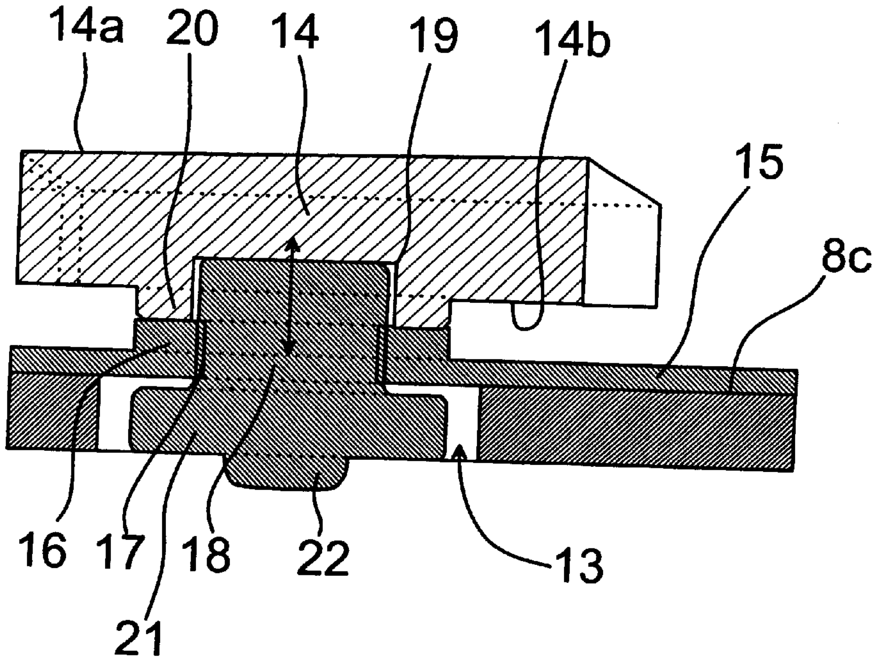
Figure 4:
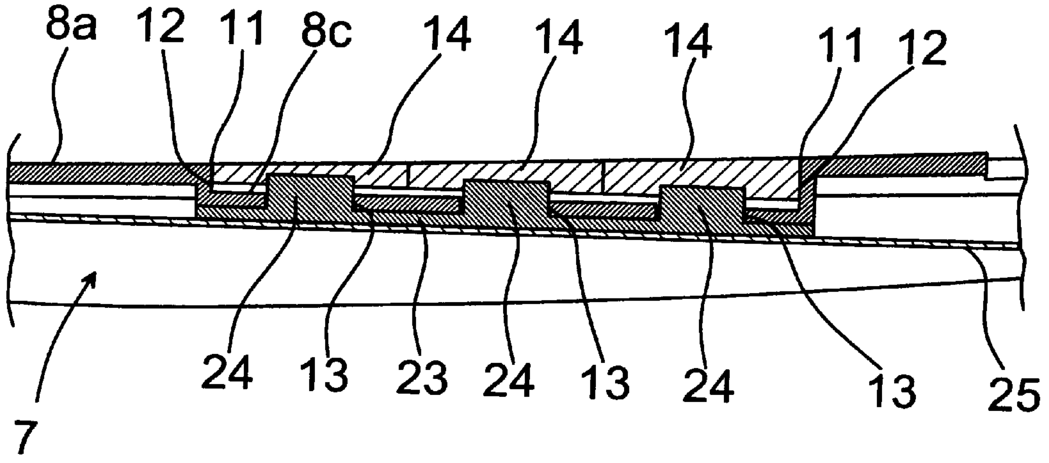

FIG. 1 shows a housing according to prior art for an electronic device, particularly a CMT device, in a perspective view, FIG. 2 shows a housing according to the invention for an electronic device, particularly a CMT device, in a perspective view, FIG. 3 shows, in a partial view, the keyboard, particularly its key cap, according to a first embodiment of the invention, fitted in a recess of the housing, in a sectional side view, and FIG. 4 shows, in a partial view, the keyboard, particularly its key cap, according to the first embodiment of the invention, fitted in a recess of the housing, in a sectional side view.

DETAILED DESCRIPTION OF THE INVENTION

FIG. 1 shows a housing 1 according to prior art comprising an outer surface 2, which constitutes the outer surface of the final device, and the inner surface 3, which is placed inside the assembled device. The housing 1 constitutes the upper part of the housing of a CMT device, wherein its outer surface 2 is simultaneously the front surface of the device. The outer surface 2 comprises a substantially flat surface 2*a* which is surrounded by a substantially transverse edge surface 2*b* which partly constitutes the side surface of the device. When a housing with a corresponding size and shape is coupled underneath the housing 1 in such a way that their inner surfaces face each other, a closed piece is formed, inside which it is possible to place a circuit board, electronics, display means and keyboard means for the device, which are known as such. The housing 1 is normally made of a plastic material by injection moulding. The housing 1 is provided with a square opening 4 for display means known as such. The display is placed in substantially the same plane as the outer surface 2. The housing 1 can also belong to a first housing in a PDA/CMT device, provided with a CMT user interface (UI) and hinged with a second housing, wherein a PDA user interface is fitted between the housings.

Further with reference to FIG. 1, the front surface 2*a* of the housing 1 is provided with a set of square openings 5. The shape of the openings 5 can vary, being for example circular or elliptical according to the key caps used at the time. The set of keys of the CMT device comprises at least nine numerical keys arranged in a matrix. In addition to this, the area between the key matrix and the display is provided with as many as six keys for other functions, e.g. for calling, terminating a call and menu functions. Corresponding openings are provided for these keys.

Each key cap is placed in an opening 5 which is penetrated by them, normally extending slightly higher than the level of the front surface 2*a* to transfer pressings. Even when pressed down, the key caps are placed with their top surfaces substantially on the level of the front surface 2*a*. Necks 6 are formed between the openings 5 to reinforce the housing 1 and causing the above-described problems.

FIG. 2 shows a housing 7 according to the invention, which substantially corresponds to the design of the housing 1 of FIG. 1, comprising an outer surface 8. The outer surface 8 also consists of a front surface 8*a* and edge surfaces 8*b*. The front surface 8*a* is provided with an opening 9 for display means. According to the invention, the outer surface 8, particularly its front surface 8*a,* comprises a lowered planar part, a bottom surface 8*c*. The surface 8*c* is substantially flat, and in the presented embodiment it covers an area taken by nine numerical keys of the keyboard. A recess 10 is thus formed on the outer surface 8 for the keyboard, particularly its key caps. The surface 8*c* is connected to the edges 11 of the front surface 8*a* by means of four walls 12. The wall 12 is substantially planar and substantially perpendicular to the surfaces 8*a* and 8*c*. The wall 12 encircles the surface 8*c,* being seamlessly integrated with the front surface 8*a* and the surface 8*c,* wherein the housing 1 with its recess 10 can be made at one time and of a plastic material by injection moulding. With regard to the tightness of the device, it is advantageous that the surface 8*c* or the wall 12 comprise a minimum number of openings or holes to be sealed in view of the operation.

It is obvious that the outer surface 8 can also be provided with other separate and corresponding recesses, particularly for the above mentioned function keys. These keys can also be placed in connection with the numerical keys, wherein the recess 10 is also provided with a space for them. It is obvious that the shapes of the recess 10 and the edge 11 can be different from the square form shown in FIG. 2, depending on the design of the key caps themselves.

With reference to FIG. 3, the key caps 14 are moved by the force of a pressing and are returned by themselves, wherein the movement takes place in a direction which is substantially perpendicular to the surface 8*c*. Inside the housing of the electronic device, underneath the surface 8*c,* is placed a stationary circuit board to which the movement is transferred by means of a key pad to produce a short circuit. For this purpose, the surface 8*c* is provided, as shown in FIG. 2, with an opening 13 for each key, one key cap 14 being always placed on top of one opening 13. FIG. 3 shows a cross-section via the central point of an opening 13, and the cross-sectional plane is perpendicular to the surface 8*c*.

With reference to FIG. 3, a key dome of a key pad is placed in the opening 13, wherein the key pad is also placed underneath the surface 8*c,* or the opening 13 accommodates a pin-like means 18 attached to the key cap 14 to transfer a pressing, wherein the key pad can be at least partly placed also on top of the surface 8*c,* under the key caps. The pin-like means 18 also extends through a sheet 15 made of an elastic rubber material and covering the surface 8*c* preferably totally. The sheet 15 also constitutes one layer of the key pad, wherein the part of the housing 7 formed by the surface 8*c* is left between the structure of the key pad. By each opening 13 and key 14, the sheet 15 is provided with a hole 17 which is surrounded by a protruding collar 16 and in which said means 18 is placed. The collar 16 and the means 18 are moved together with the key cap 14, wherein the opening 13 is preferably circular and has a diameter which is greater than the diameter of said annular collar 16. Thus, the collar 16 can move into the opening 13 and thereby towards the inner parts and the circuit board of the device, wherein the elastic, rubber-like sheet material 15 is simultaneously stretched and also returns the key cap 14 in a spring-like manner to its rest position. In the rest position, the upper surface 14*a* of the key cap 14 is placed substantially on the same plane as the front surface 8*a*. The key caps 14 can thus be placed next to each other, wherein they are only separated by a narrow space from each other and from the edge 11, and at the keyboard, the strength of the housing 7 is attributed to the lowered surface 8*c*.

In the presented example, the first end of the means 18 is attached to a circular recess 19 formed on the lower surface 14*b* of the cap 14 and surrounded by a collar 20. A rim 21 is formed around the second end, having a diameter greater than the hole 17 and greater than the opening 13. The rim 21 is placed in the hole 13. A bulge 22 of the second end transfers the movement to the circuit board. The rubber pad 15 which is placed tightly against the surface 8*c* and is preferably attached to the surface 8*c*, and a tight fit or fixing placed between the means 18 and the pad 15 are used to form a compact unit to close the openings 13.

FIG. 4 presents another advantageous embodiment of the invention. FIG. 4 is shown in a cross-section through the centre of the openings 13, and the cross-sectional plane is perpendicular to the surface 8*c*. The corresponding parts of FIGS. 3 and 4 are indicated with the same reference numerals. In the presented embodiment, the key caps 14 are fixed at their lower surfaces to key domes 24 of a key pad 23 which penetrate the housing 7 through the openings 13. The key pad 23 is fixed on the circuit board 25 of the device which is provided, by means of strip conductors, with contacts, known as such, which are short circuited by the key domes 24. Underneath the dome 24, there can be placed a metal bell which clicks and short circuits the contacts in a way known as such, or the lower surface of the dome 24 is provided with a conductive material which short circuits the contacts. The click is produced by a buckling of the rubber key dome 24. Also various films can be placed between the key domes 24 and the circuit board 25, and further, on top of said metal bell or key dome, a separate part used as an actuator is preferably placed on top of said metal bell or key dome to improve the feel of buckling. The actuator, known as such, can also be integrated in the bell or dome. The key pad 23 is normally a solid, thermoformed piece, and in the fixing of the key caps 14 to the dome 24, it is possible to utilize e.g. laser welding, ultrasonic welding, gluing or another method which is known as such and is selected on the basis of the materials available and the applicability of the manufacturing apparatuses. By gluing the pad 23 under the surface 8*c* in the housing 7, a particularly compact structure is achieved, preventing the entry of moisture and dirt to the circuit board 25.

In the above description, the invention has been described when applied in connection with the housing of an advantageous wireless communication device, a CMT device, but it is not limited solely to these preferred embodiments. The invention can also be applied in connection with other electronic devices within the scope of the claims.

What is claimed is:

1. A housing for an electronic device, which is arranged to constitute at least part of the housing structure protecting said device, said housing comprising:

a front surface constituting the front surface of said device and comprising a recess for a keyboard of said device, wherein said keyboard comprises at least a set of key caps arranged next to each other for pressings, wherein at least said key caps are fitted in said recess, wherein said recess also comprises a bottom surface attached to said front surface and a set of openings formed in said bottom surface and for transferring said pressings via them, and wherein the upper surface of the key caps is fitted substantially in the same plane with said front surface.

2. A housing according to claim 1, wherein the recess comprises a all surrounding and bearing said bottom surface.

3. A housing according to claim 1, wherein said recess is attached to said housing in a seamless manner, constituting an integrated unit made of a plastic material.

4. A housing according to claim 1, wherein the keyboard also comprises means for transferring said pressing of the keys via said openings.

5. A housing according to claim 1, wherein said transferring means comprises a sheet of elastic material fitted on said bottom surface and a pin located on said opening, wherein said pin extends through the sheet, and wherein a key cap is attached to said pin.

6. A housing according to claim 5, wherein said pin comprises a first end attached under said key cap and a second end for transferring said pressing to said circuit board.

7. A housing according to claim 1, wherein the keyboard comprises a key pad which is at least partly placed in said recess, or which is placed underneath said recess.

8. A housing according to claim 1, wherein adjacent key caps are separated from each other only by an air slot.

9. A housing according to claim 1, wherein the keyboard further com rises a key pad placed underneath said bottom surface and comprising key domes, said key domes penetrating said opening and being fixed to said key caps.

10. An electronic device comprising:

a housing which protects the device and constitutes the front surface of said device, a recess formed on said front surface, a fitted keyboard which comprises a set of key caps fitted next to each other for pressings, a circuit board fitted under said recess, and means for transferring pressings of the keys to said circuit board, wherein said key caps are fitted in said recess which is formed on said front surface, wherein said recess comprises a bottom surface attached to said front surface, a set of openings formed in said bottom surface and provided for transferring said pressings via them, and wherein the upper surface of the key caps is fitted substantially in the same plane with said front surface.

11. An electronic device according to claim 10, wherein adjacent key caps are separated from each other only by an air slot.

12. An electronic device according to claim 10, wherein th recess comprises a wall surrounding and bearing said bottom surface.

13. An electronic device according to claim 10, wherein said transferring means comprise a sheet of elastic material fitted on sad bottom surface and a pin located on said opening, wherein said pin extends through the sheet, and wherein a key cap is attached to said pin.

14. An electronic device according to claim 13, wherein said pin comprises a first end attached under said key cap and a second end for transferring said pressing to said circuit board.

15. An electronic device according to claim 10, wherein the keyboard further comprises a key pad placed underneath said bottom surface and comprising key domes, said key domes penetrating said opening and being fixed to said key caps.

16. A method in the manufacture of a housing for an electronic device, which housing is arranged to form at least part of the housing structure protecting said device, said method comprising:

providing said housing with at least a surface for the front surface of the device, providing said front surface simultaneously with a recess for the keyboard of said device, wherein said keyboard comprises at least a set of key caps arranged next to each other for pressings, and wherein said recess also comprises bottom surface attached to said front surface and a set of openings formed in said bottom surface and for transferring said pressings via them, fitting at least said key caps in said recess, and fitting the upper surface of the keycaps substantially in the same plane with said front surface.

17. A method according to claim 10, further comprising separating adjacent key caps from each other only by an air slot.

18. A method according to claim 10, further comprising fitting a sheet of elastic material on said bottom surface, wherein said sheet comprises a pin located on said opening, wherein said pin extends through the sheet, and wherein a key cap is attached to said pin.

19. A method according to claim 10, further comprising placing a key pad underneath said bottom surface, wherein said key pad comprises key domes penetrating said opening and being fixed to said key caps.

20. A method according to claim 10, further comprising placing a key pad in said recess.

21. A method according to claim 16, wherein said housing is manufactured of a plastic material by injection molding.

* * * * *